(12) United States Patent  (10) Patent No.: US 9,040,892 B2
Smith  (45) Date of Patent: May 26, 2015

(54) HIGH DYNAMIC RANGE IMAGE SENSOR HAVING SYMMETRIC INTERLEAVED LONG AND SHORT EXPOSURE PIXELS

(75) Inventor: Scott T. Smith, San Jose, CA (US)

(73) Assignee: Apple Inc., Cupertino, CA (US)

( * ) Notice: Subject to any disclaimer, the term of this patent is extended or adjusted under 35 U.S.C. 154(b) by 335 days.

(21) Appl. No.: 13/560,205

(22) Filed: Jul. 27, 2012

(65) Prior Publication Data

US 2014/0027613 A1   Jan. 30, 2014

(51) Int. Cl.
| | |
|---|---|
| *H01L 27/146* | (2006.01) |
| *H04N 5/235* | (2006.01) |
| *G03B 7/083* | (2006.01) |
| *H04N 5/355* | (2011.01) |

(52) U.S. Cl.
CPC ........ *H01L 27/14621* (2013.01); *H04N 5/2352* (2013.01); *G03B 7/083* (2013.01); *H04N 5/35536* (2013.01); *H04N 5/2353* (2013.01); *H01L 27/14643* (2013.01)

(58) Field of Classification Search
USPC ................. 250/214.1, 214 R, 214 DC, 208.1; 348/221.1, 222.1, 277, 273, 280, 297, 348/305, 320, 321, 322, 323, 279
See application file for complete search history.

(56) References Cited

U.S. PATENT DOCUMENTS

| | | | |
|---|---|---|---|
| 8,059,174 B2 | 11/2011 | Mann et al. | |
| 8,605,177 B2 * | 12/2013 | Rossi et al. | 348/296 |
| 8,798,395 B2 * | 8/2014 | Jo | 382/284 |
| 2009/0021588 A1 | 1/2009 | Border et al. | |
| 2009/0290052 A1 * | 11/2009 | Liu et al. | 348/277 |
| 2010/0310190 A1 | 12/2010 | Lin | |
| 2013/0182154 A1 * | 7/2013 | Kimura | 348/272 |

* cited by examiner

*Primary Examiner* — Francis M LeGasse, Jr.
(74) *Attorney, Agent, or Firm* — Blakely, Sokoloff, Taylor & Zafman LLP

(57) ABSTRACT

To generate data for color pixels in an image, Bayer symmetric interleaved exposures can more evenly spread the long exposure pixels in the vertical direction and produce a higher dynamic range by having pixels with different exposure times interleaved within different rows. Long and short exposure pixels can be interleaved across two adjacent rows to form 4 pixel wide by 2 pixel tall blocks that are repeated across a Bayer pattern color array. In each block, the first row can be three long and one short exposure pixel; and the second row can be three short and one long exposure pixel. The long exposure pixels can form an "L" shaped pattern rotated 90 degrees clockwise; and the short exposure pixels can form an "L" shaped pattern rotated 90 degrees counter-clockwise. Subsequent rows of the blocks may be offset horizontally to form diagonal bands of long and short exposure pixels.

19 Claims, 11 Drawing Sheets

LONG EXPOSURE – T1
PATTERN 22

SHORT EXPOSURE – T2
PATTERN 23

HIGH DYNAMIC RANGE IMAGE SENSOR HAVING SYMMETRIC INTERLEAVED LONG AND SHORT EXPOSURE PIXELS

Embodiments of the invention relate to digital color image sensors, and more particularly, to an enhanced dynamic range sensor that utilizes a Bayer pattern color array having pixels with different exposure times interleaved within different rows to generate the data for color pixels in an image.

BACKGROUND

Digital imaging systems (e.g., cameras) have quickly become a standard feature for portable devices including portable multimedia players, smart phones, and tablet computers. The image quality expectations from these portable cameras has grown as higher quality and higher megapixel cameras have been incorporated into such small devices.

In most instances the most desirable images are produced when the sensors in those devices can capture fine details in both the bright and dark areas of a scene. In other words, the quality of the captured image is often a function of the amount of detail at various light levels that can be captured. For example, a sensor capable of generating an image with fine detail in both the bright and dark areas of the scene is generally considered superior to a sensor that captures fine detail in either bright or dark areas, but not both simultaneously.

Thus, higher dynamic range becomes an important concern for digital imaging performance. For sensors with a linear response, their dynamic range can be defined as the ratio of their output's saturation level to the noise floor at dark. This definition is not suitable for sensors without a linear response. For all image sensors with or without linear response, the dynamic range can be measured by the ratio of the maximum detectable light level to the minimum detectable light level.

Many prior dynamic range extension methods fall into two general categories: improvement of sensor structure, a revision of the capturing procedure, or a combination of the two. One approach used to extend a camera's dynamic range is to employ a multiple exposure (ME) scheme where each exposure captures a different light range of the scene. ME techniques often suffer from motion artifacts when objects in the scene change position between each exposure frame. ME techniques that use multiple frame captures are not ideal for video or photos with motion unless the frame rate of the camera is high enough to avoid motion artifacts. Thus, an important feature for digital cameras is to have a wide dynamic range image or video capture capability by allowing the camera to capture bright and dark areas of a scene, without such ME technique drawbacks.

SUMMARY

Embodiments of the invention provide a Bayer pattern color image array sensor with improved ME sensor data for color pixels in an image by using Bayer symmetric interleaved sensor that interleave long and short exposure pixels across two adjacent pixel rows of the sensor. The Bayer symmetric interleaved exposures can more evenly spread the long exposure pixels in the vertical direction and produce a higher dynamic range by having pixels with different exposure times interleaved within different rows. Long and short exposure pixels can be interleaved across two adjacent rows to form 4 pixel wide by 2 pixel tall blocks that are repeated across a Bayer pattern color array. In each block, a first row can have three long exposure pixels and one short exposure pixel; and a second row can have three short exposure pixels and one long exposure pixel. The long exposure pixels may form a first pattern shaped like (e.g., having a perimeter of the pixels forming the outline of) a capital "L" rotated 90 degrees clockwise; and the short exposure pixels may form a second pattern shaped like a capital "L" rotated 90 degrees counter-clockwise. The efficient blocks may be repeated throughout the entire array. Subsequent rows of the blocks may be offset by two pixels horizontally to form diagonal bands of long and short exposure pixels.

As compared to other configurations of long and short exposure pixels, use of the Bayer symmetric interleaved exposures or efficient blocks of pixels may: (1) more evenly spread the long exposure pixels in the vertical direction causing the vertical resolution to be effectively doubled, and (2) more efficiently produces a higher dynamic range in the image sensor.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
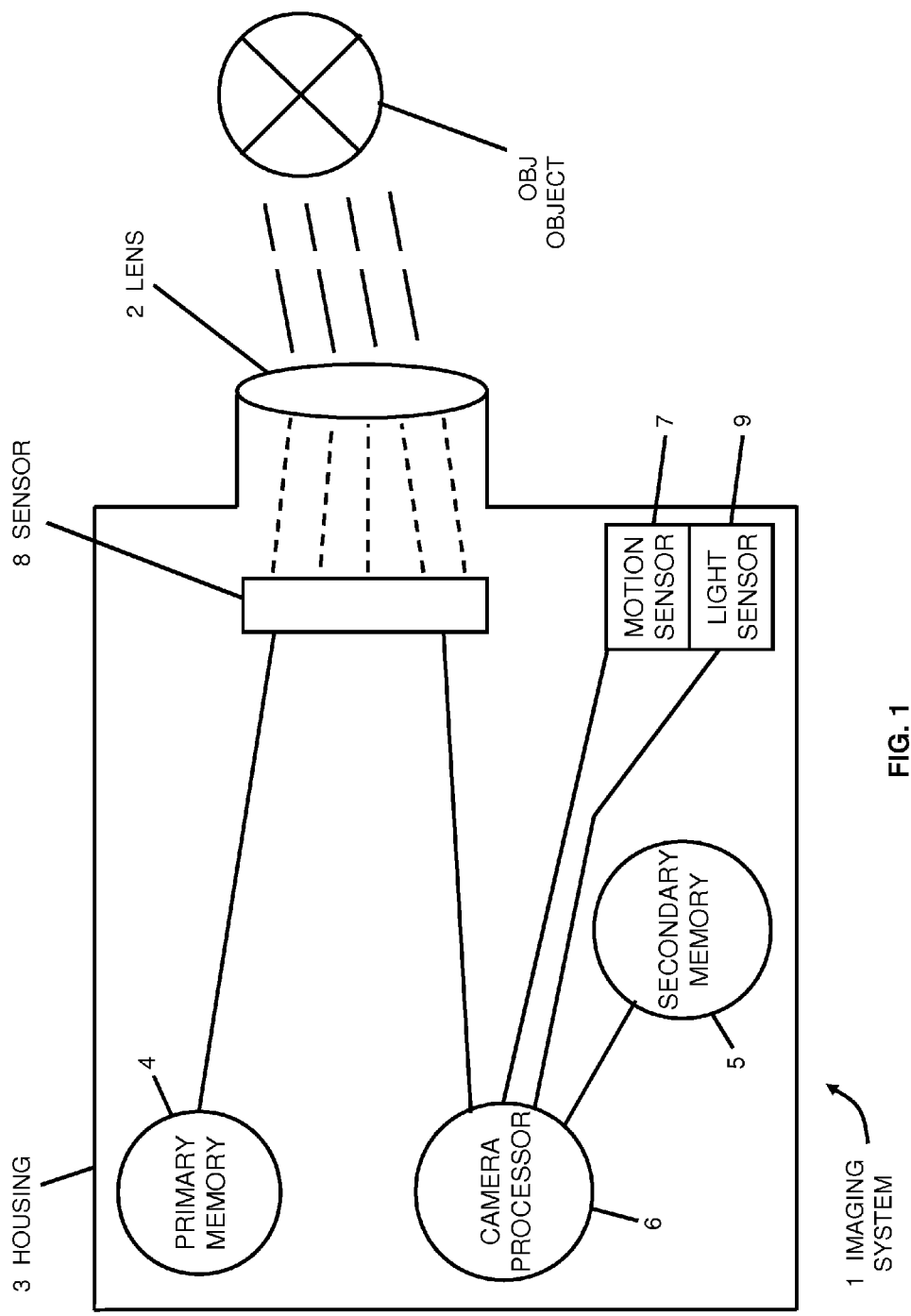
FIG. 1 is a block diagram of one type of digital imaging system.

A typical portable device may include an imaging system such as imaging system 1 depicted in FIG. 1. The imaging system includes housing 3, which contains at least one lens 2, a primary memory unit 4, camera processor 6, and at least one image sensor (also referred to as an imager) 8. The primary memory unit 4 can be used to store digital images (e.g., still images and/or video images—frames) and computer software for performing various functions in the imaging system 1. A removable, secondary memory unit 5 in the form of a memory card can also be optionally included in the digital camera to provide extra memory space. Image sensor 8 can be a charge coupled device (CCD), a complementary metal oxide semiconductor (CMOS) imager, or another system as known in the art. The imaging system 1 may optionally also include at least one motion sensor 7 operatively connected to the camera processor 6. The motion sensor may be used to determine a focus distance and/or shutter speed to be used by the camera and imaging system when taking a picture or video. The imaging system 1 may optionally also include at least one light sensor 9 operatively connected to the camera processor 6. The light sensor may be used to determine a shutter speed, image brightness and/or contrast selection to be used by the imaging system when taking a picture (still or video). When a still picture or video (generically referred to here as an image) of an object OBJ in the scene is about to be taken, lens 2 focuses the image onto an area of image sensor 8 which records light electronically. This electronic information is processed (e.g., by processor 6) into digital data (e.g., image frames), which can be stored in memory as still images (e.g., pictures) and/or video (e.g., frames). Video may be synchronized with audio input from a microphone. The imaging system 1 can be a stand-alone device (e.g., a camera module in housing 3 with electronic connectors); or can have its components incorporated into circuitry of another electronic device, such as a portable device or telephone system.

Sensor 8 may represent or be a digital camera image array sensor of different color pixels. Sensor 8 may be (or may be implemented as) a rolling shutter image sensor. For example, for a global shutter sensor, the imaged scene will be "frozen" in time, provided that the integration time is short enough i.e. there is no motion blur. However, a rolling shutter sensor (e.g., in a CMOS image sensor) works differently, in that the pixels (e.g., photodiodes) do not collect light at the same time. In some cases, all pixels in one row of the sensor collect light during exactly the same period of time, but the time at which light collection starts and ends are slightly different for each row. For some of these sensors, the top row of the sensor is the first one to start collecting the light and is the first one to finish collecting. The start and end of the light collection for each following row is slightly delayed. The total light collection me for each row is the same, and the delay between rows is constant. However, there can also be delay during the readout of each pixel as the pixels are readout from left to right (or otherwise) in a row. The time delay between a row being reset and a row being read is the integration time. By varying the amount of time between when the reset sweeps past a row and when the readout of the row takes place, the integration time can be controlled.

Sensor 8 may use a multiple exposure (ME) technique. In some embodiments, image sensor 8 may be a Bayer pattern color pixel array sensor that implements a dual exposure high dynamic range (HDR) technique. One way to improve motion artifact problems for ME HDR capture using sensor 8 is to interleave exposures within the pixel array of the image sensor in the camera such that some pixels have a long exposure while others have a short exposure. Although spatial interleaving of exposures can reduce motion artifacts by overlapping exposures within a readout frame time, the short exposures cause spatial resolution to be reduced for each exposure image.

Figure 2:
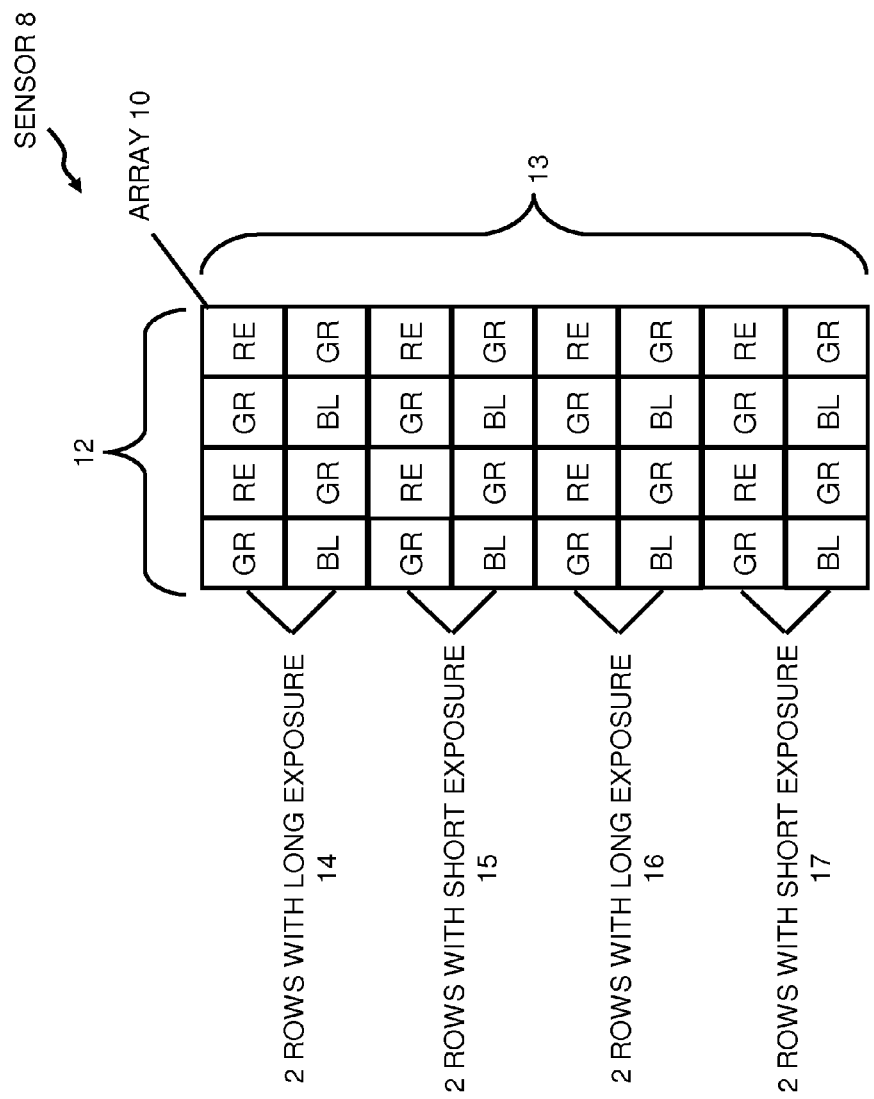
FIG. 2 shows a Bayer pattern pixel array sensor for implementing interleaved dual exposure high dynamic range (HDR) by having alternating row pairs of long and short exposures, in accordance with embodiments of the invention.

For example, one way to implement interleaved dual exposure HDR for a Bayer pattern pixel array sensor is to design the pixel array timing to have alternating row pairs of long and short exposures. FIG. 2 shows Bayer pattern pixel array sensor 8 for implementing interleaved dual exposure high dynamic range (HDR) by having alternating row pairs of long and short exposures. FIG. 2 shows sensor 8 having array of pixels 10 with columns 12 of pixels and rows 13 of pixels. Rows 13 interleave rows of exposures within the pixel array of the image sensor in the camera such that some rows, such as rows 14 and 16 have a long exposure (e.g., exposure time T1 of longer exposure), while others rows, such as rows 15 and 17 have a short exposure (e.g., exposure time T2 of shorter exposure, which is shorter than T1). The exposure pattern of FIG. 2 may also be referred to as "Bayer pair interlaced exposures."

Alternating row pair exposure interlacing may be easy to implement with a rolling shutter image sensors since most designs begin and end exposure periods with row address reset and readout circuits. In addition, this system of interleaving two exposures is effective for allowing the exposure times to be overlapped during one readout frame period of the image sensor. However there is a large impact to vertical resolution for each exposure since two rows are skipped for every two rows exposed. Thus, this interleaving pattern produces large aliasing in the vertical direction and loss in image resolution.

To improve effective spatial resolution and enhance dynamic range of digital color image sensors that use a Bayer pattern color array, pixels with different exposure times can be interleaved within different rows to generate the data for color pixels in an image. This document now discloses embodiments of image sensors, systems and processes to use an interleaved multi-exposure pixel array that provides optimal spatial resolution for a Bayer pattern pixel array while allowing time overlapped exposures for improved motion artifacts. Such interleaving may be described as "Bayer symmetric interleaved exposures" and may increase the performance of an optical system from only using ME techniques, and from only having alternating row pairs of long and short exposures. In some embodiments, Bayer symmetric interleaved exposures may use "efficient blocks" of pixels of a Bayer pattern color image array sensor that interleave long and short exposure pixels across two adjacent rows of the sensor. In some cases, an efficient block of pixels is a 4 wide by 2 tall block of pixels having a first row having of three long exposure pixels and one short exposure pixel; and a second row having three short exposure pixels and one long exposure pixels. Within each efficient block, the long and short exposure pixels may each form "patterns".

Figure 3A:
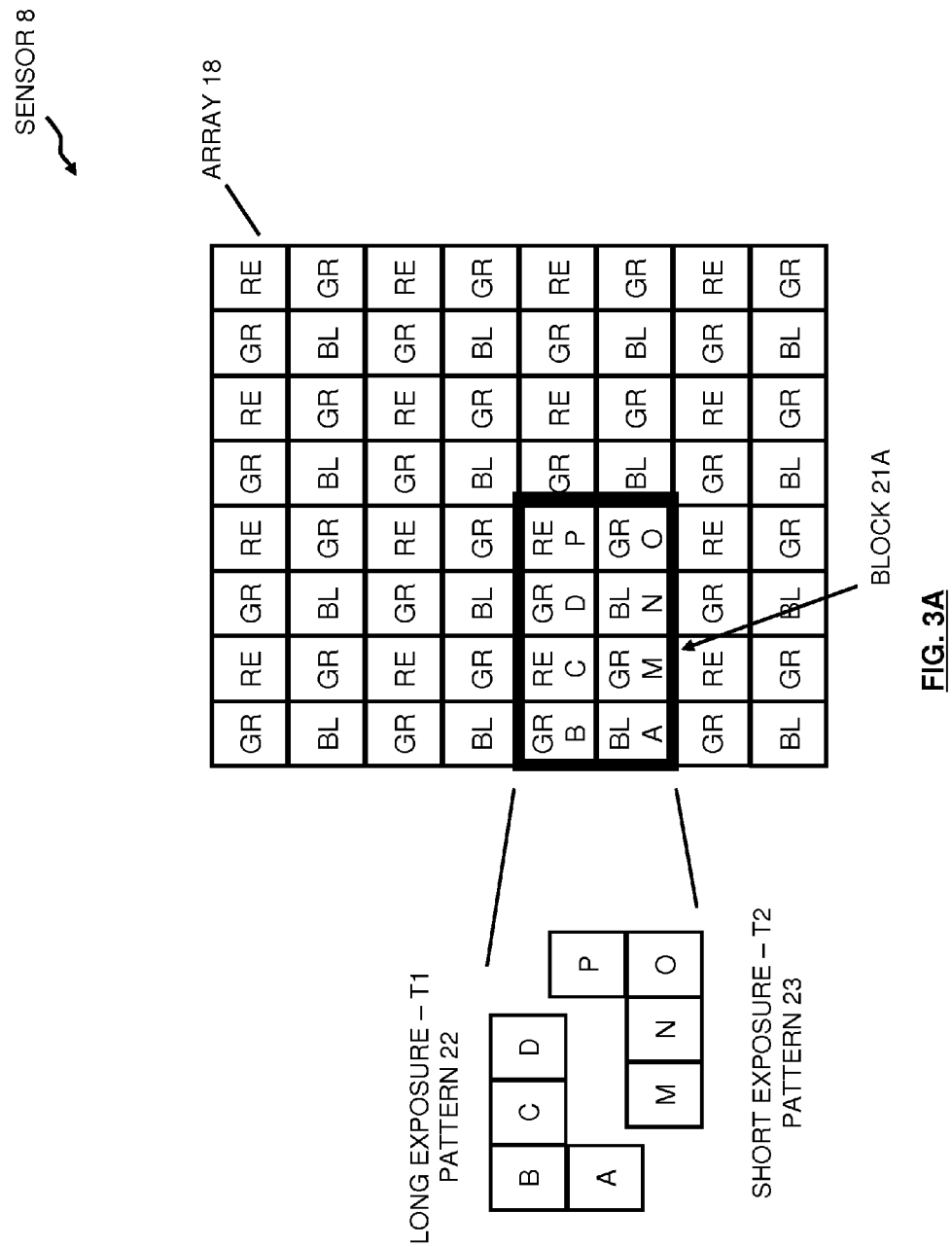
FIG. 3A shows a pattern of long exposure pixels and a pattern of short exposure pixels that extend across adjacent rows, such as to form an efficient block of pixels for imaging using Bayer symmetric interleaved exposures, in accordance with embodiments of the invention.

FIG. 3A shows pattern 22 of long exposure pixels and pattern 23 of short exposure pixels that extend across adjacent rows, such as to form an efficient block of pixels for imaging using Bayer symmetric interleaved exposures, in accordance with embodiments of the invention. Pattern 22 may be described as a capital "L" shape of 4 pixels rotated 90 degrees clockwise as a pattern for long exposures (e.g., long exposure pixel pattern "ABCD" of FIG. 3A). Pattern 23 may be described as a capital "L" shape of 4 pixels rotated 90 degrees counter-clockwise as a pattern for short exposures (e.g., short exposure pixel pattern "MNOP" of FIG. 3A). Pattern 22 of long exposure pixels may have exposure time T1 of longer exposure, while pattern 23 of short exposure pixels have exposure time T2 of shorter exposure (e.g., shorter than T1). In another embodiment, however, pattern 22 may be a pattern of short exposure pixels (time T2), while pattern 23 is a pattern of long exposure pixels (time T1 that is longer than T2). In some cases, exposure time T1 and T2 may be periods of time similar to those used for Bayer row pair interlaced exposure long and short exposure times.

According to some embodiments, typical exposure ratios between T1 and T2 (e.g., T1/T2 ratio) that would be used to extend the dynamic range are from 4 to 50. Any exposure ratio may be employed although an exposure ratio is below 4 may not provide enough range extension to capture HDR scenes. Increasing the exposure ratio to larger values may provide more range extension, however there may be practical limitations due to the signal to noise ratio (SNR) discontinuity that occurs when a signal transitions from T1 to T2. Pixel "photon shot noise" and pixel "full well" may determine the overall practical upper limit of the exposure ratio. For example, if a pixel has a full well signal capacity of 10,000 electrons, the maximum SNR at max signal is 100, where SNR=square root of signal level. If the T1/T2 ratio is 32, then when the input signal may be high enough to saturate T1 pixels and T2 pixels are used to capture the signal, the T2 signal starts at 10,000 electrons divided by 32 which is a signal level of 312.5 electrons and an SNR level of 17.7. This SNR level may show visible noise in the image at T1/T2 transition signal levels. According to some embodiments, a practical limit may be a ratio of 16 where the SNR would be 27. Typical exposure times for still snapshots may be as high as 66 ms (1/15 second) in which case T1 may be set to 66 ms, and with an exposure ratio of 15, T2 may be set to 4.4 ms. For video applications, it is often desirable to have 30 or 60 frames per second video rate. In these cases, T1 may have 33 ms max exposure for 30 fps and 16.67 ms max exposure for 60 fps, and with a ratio of 15, T2 may have an exposure of 2.2 ms for 30 fps and 1.1 ms for 60 fps operation.

FIG. 3A also shows the combination of patterns 22 and 23 which may be called an "efficient block of pixels", such as shown by efficient block 21A used in a Bayer pattern pixel array, such as array 18 of pixels of sensor 8. According to some embodiments, pattern 22 may be described as three long exposure pixels in the first adjacent and abutting row R1 of the sensor array, and a fourth long exposure pixel in the second adjacent and abutting row R2 of the sensor array, where the fourth long exposure pixel is below the left most one of the 3 long exposure pixels. In this case, the second pattern 23 may be described as three short exposure pixels in the second adjacent and abutting row R2 of the sensor array, and a fourth short exposure pixel in the first adjacent and abutting row R1 of the sensor array, where the fourth short exposure pixel is above a right most one of the 3 short exposure pixels. In some cases, image sensor array 18 may include or be formed on a substrate (e.g., semiconductor chip); wherein the pixels of the first and second pattern are adjacent and abutting in the x and y directions.

Figure 3B:
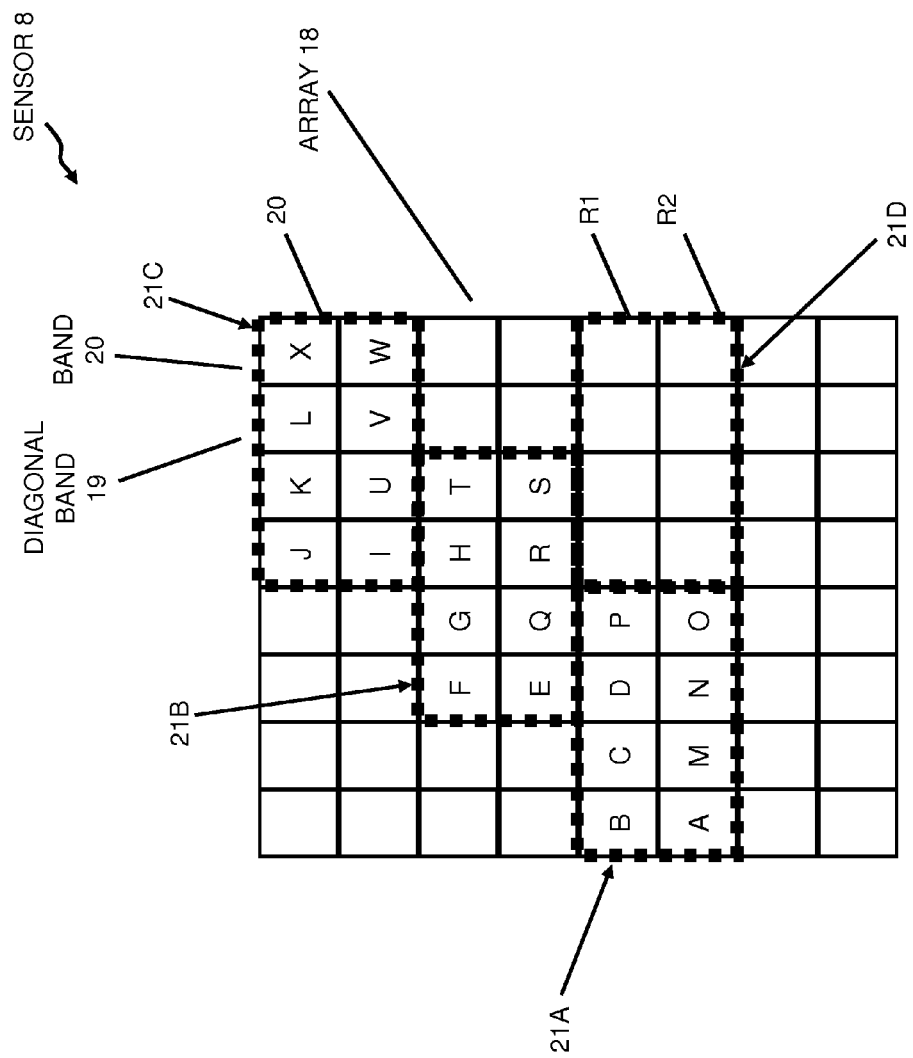
FIG. 3B shows Bayer pattern pixel array sensor for implementing interleaved dual HDR by having pixels with different exposure times interleaved within different rows, in accordance with embodiments of the invention.

FIG. 3B shows a Bayer pattern pixel array (e.g., for a sensor) for implementing interleaved dual HDR by having pixels with different exposure times interleaved within different rows to generate the data for color pixels in an image. FIG. 3B shows pattern 22 and 23 of FIG. 3A used in array 18 of pixels having pattern 22 of long exposure pixels and pattern 23 of short exposure pixels that extend across adjacent rows. Array 18 may be an interleaved multi-exposure pixel array including circuitry and timing control to provide optimal spatial resolution for a Bayer pattern pixel array while allowing time overlapped exposures for improved motion artifacts (e.g., see FIGS. 5-8).

Instead of alternating pairs of complete rows of pixels (e.g., of FIG. 2), embodiments of the invention shown in FIG. 3A-B repeat new patterns (e.g., patterns 22 and 23) across array 18 to form diagonal bands 19 and 20 of long exposure pixels A-L (e.g., having exposure time T1) and short exposure pixels M-X (e.g., having exposure time T2) so that there is not a large impact to vertical or horizontal resolution. It is considered that patterns 22 and 23 may extend across or over the entire surface of array 18, such that each diagonal band shown (e.g., pixels A-X) continues with long and short exposure pixels to the edges of the array. Similarly, the pattern of interleaved diagonal bands of long and short exposure pixels may extend above and below the bands shown (e.g., pixels A-X). For instance, a short exposure band may be above the band having pixels A-L, and a long exposure band may be below the band having pixels M-X, and the interleaving may continue until all the pixels of the array are included in the interleaved bands of long and short exposure pixels.

In some cases, the exposure pattern of FIGS. 3A-B may extend across the entire area of array 18, such as by having all of the pixels of the array be pixels of efficient blocks extending across the entire area of array 18. In some cases, the edges of the array may be arranged so that each pattern 22 and 23 is completed. In other case, the edges may not contain completed patterns. It is also considered that other special pixels or special edge pixels may be included in the array (e.g., sensor 8).

For instance array 18 has pattern 22 implemented as pixels A, B, C and D in rows R1 and R2. Adjacent to and in the same two rows (R1 and R2) as pattern 22, pattern 23 may be implemented as pixels M, N, O and P. Thus, pixels B, C, D and P are in row R1, while pixels A, M, N and O are in row R2. It is noted that in other embodiments, the order of rows R1 and R2 can be reversed so that pixels B, C, D and P are in row R2, while pixels A, M, N and O are in row R1.

In some embodiments, the combination of patterns 22 and 23 may be called an "efficient block of pixels", such as shown by efficient block 21B including pattern 22 implemented as pixels E, F, G and H, and adjacent to and in the same two rows as that pattern, having pattern 23 implemented as pixels Q, R, S and T. Efficient block 21C is formed by a third and different set of rows is shown with pattern 22 implemented as pixels I, J, K and L; and adjacent to and in the same two rows, pattern 23 implemented as pixels U, V, W and X.

Thus, efficient block 21A may be repeated across the same two rows, rows R1 and R2, such as shown by efficient block 21D. The efficient block may be repeated in each adjacent two rows, above and below rows R1 and R2, such as shown by efficient block 21B. The repeated efficient block in each adjacent row may be offset by two pixels horizontally to form diagonal bands 19 and 20 of long and short exposure pixels. It can be appreciated that other offsets may also be used, such as an offset of 1 or 3 pixels.

The use of patterns 22 and 23, or efficient blocks (e.g., as shown in FIG. 3A-B) may provide a more even spread of the long exposure pixels in the vertical direction, and the vertical resolution is effectively doubled. The exposure pattern of FIGS. 3A-B may be referred to as "Bayer symmetric interleaved exposures", "Bayer symmetric interleaved exposure pattern" and/or "efficient blocks of Bayer symmetric interleaved exposures." To achieve this type of exposure pattern, the image sensor pixel array allows 2 different exposure times within each row of pixels, as noted above. The advantages of the efficient blocks (e.g., exposure patterns 22 and 23) include (e.g., see FIGS. 4-6 below): (1) providing increased or maximum horizontal and vertical resolution possible with interleaving two exposures; and (2) maintaining X/Y pixel kernel symmetry that leads to less image processing artifacts.

More specifically, using a 4 wide by 2 tall efficient block of interleaved long and short exposure pixels (such as patterns 22-23) may allow array 18 to (1) more evenly spread the long exposure pixels in the vertical direction causing the vertical resolution to be effectively doubled, and (2) more efficiently produce a high dynamic range in an image sensor, than other configurations of long and short exposure pixels (e.g., more efficient than interlaced rows of FIG. 2, or other patterns that are not 4×2 as shown by patterns 22 and 23). This may be because the long and short exposure pixels are mixed across the two rows in a repeatable 4×2 efficient block, such as by having 3 long and 1 short in a first row; and 1 long and 3 short in the row below or above the first row.

Figure 4:
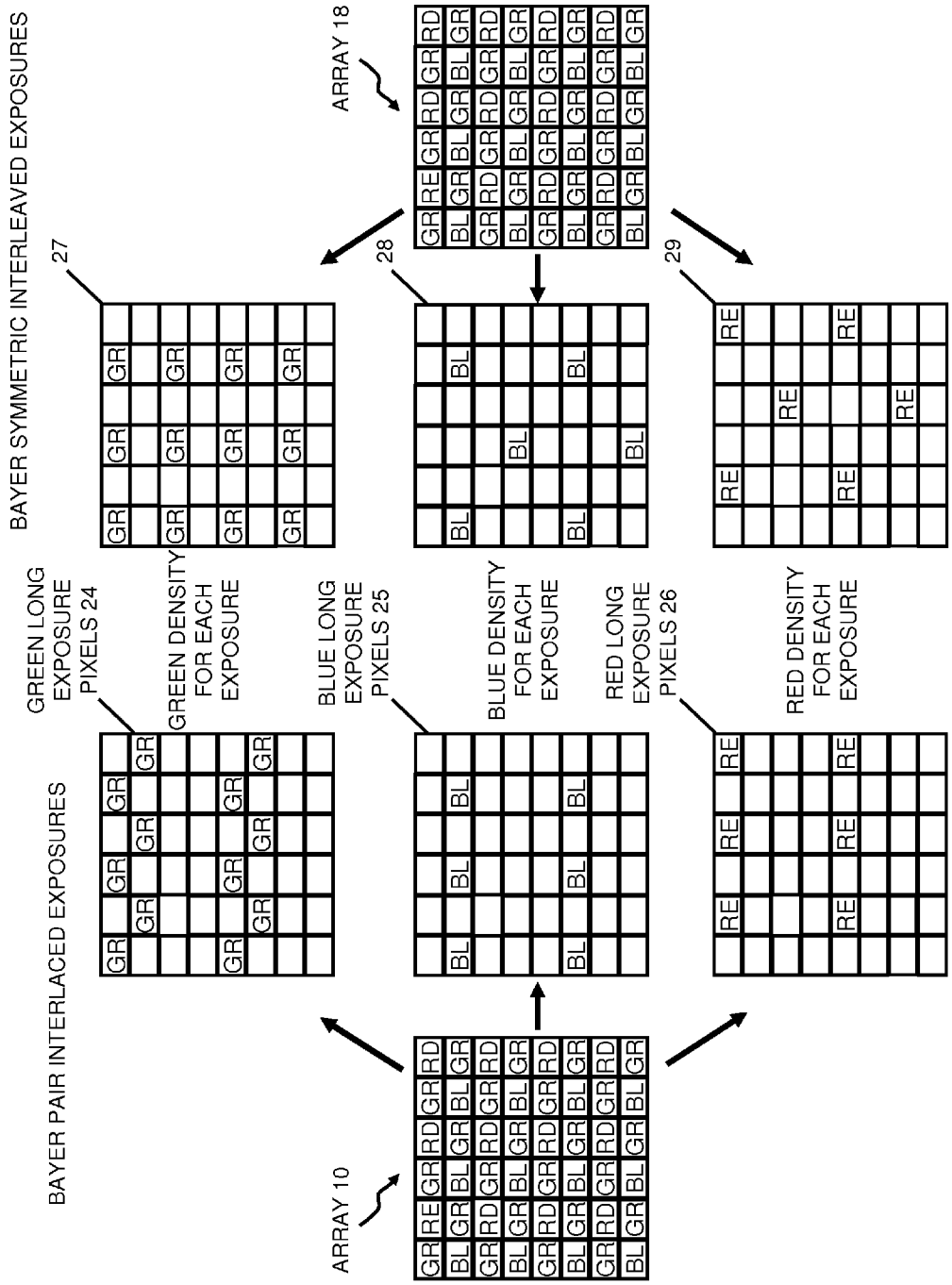
FIG. 4 is a diagram that compares the resolution of the long exposure for the Bayer row pair interlaced exposures versus Bayer symmetric interleaved exposures, in accordance with embodiments of the invention.

FIG. 4 is a diagram that compares the resolution of the long exposure for the Bayer row pair interlaced exposures versus Bayer symmetric interleaved exposures, in accordance with embodiments of the invention. FIG. 4 shows array 10 of Bayer row pair interlaced exposures 24-26, such as described for FIG. 2 (e.g., implementing a Bayer row pair interlaced process) versus array 18 of Bayer symmetric interleaved exposures 27-29, such as described for FIGS. 3A-B (e.g., implementing the Bayer symmetric interleaving process). Array 10 is "broken down" to separate out or only display certain colors—red ("RE"), green ("GR") or blue ("BL"). FIG. 4 shows interlaced exposure array 10 broken down to show its green long exposure pixels 24, blue long exposure pixels 25, and red long exposure pixels 26, showing the density in the vertical and horizontal direction off the longer (e.g., T1 time) exposure green, blue and red pixels for each exposure (e.g., after they are reset and read once). It is noted that in a Bayer pixel array, there are twice as many green pixels (e.g., often referred to as "G1" and "G2", or "GR1" and "GR2") as compared to blue (BL) or red (RE) pixels. Bayer symmetric interleaved exposure array 18 is also broken down to show its green long exposure pixels 27, blue long exposure pixels 28, and red long exposure pixels 29, showing the density in the vertical and horizontal direction off the shorter (e.g., T2 time which is shorter than T1) exposure green, blue and red pixels for each exposure (e.g., after they are reset and read once).

It can be seen that there are fewer long exposure pixels spread across the distance of the vertical direction (or in the vertical direction) for pixels 24-26 than there are for pixels 27-29. That is, the green long exposure pixels 24 are condensed into pairs of adjacent rows, while there are pairs of adjacent rows without any green long exposure pixels. When processing the image data for long exposure green pixels 24 it is necessary to extrapolate, interpolate or fill in the long exposure green color data for the 2 row vertical direction gap of green pixels. This leads to decreased vertical resolution and aliasing. However, long exposure green pixels 27 show a more uniform vertical spread because there are pixels in ever other row, and there are no pairs of rows without long exposure green pixels in either row of the pair. When processing the image data for long exposure pixels 27, less extrapolation, interpolation or filling in of the long exposure green color data is required because there is only a 1 row vertical direction gap of long exposure green pixels, instead of a 2 row gap. This leads to more vertical resolution and less aliasing (e.g., in the vertical direction).

It is noted that this increase in vertical uniformity and resolution comes at the price of not having a long exposure green pixel in each column of pixels 27, as compared to pixels 24 which do have a long exposure green pixel in each column. However, it can be appreciated that the sacrifice may be acceptable because the pattern of pixels 27 is more uniform and had an increased vertical resolution (a long exposure pixel in ever other row), while maintaining a sufficient horizontal resolution (a long exposure pixel in every other row). Another way to describe this situation is to say that the long exposure green pixels are more regular or periodic (e.g., interleaved) in the horizontal and vertical sequence and spacing of all the pixels of the array.

It can also be seen that the long exposure blue 25 are condensed into single rows, while there are three adjacent rows without any long exposure blue pixels.

When processing the image data for long exposure blue pixels 25 it is necessary to extrapolate, interpolate or fill in the long exposure blue color data for the 3 row vertical direction gap of blue pixels. This leads to decreased vertical resolution and aliasing. However, long exposure pixels 28 show a more uniform vertical spread because there are long exposure pixels in ever other row. When processing the image data for long exposure pixels 28, less extrapolation, interpolation or filling in of the long exposure blue color data is required because there is only a 1 row vertical direction gap of long exposure blue pixels, instead of a 3 row gap. This leads to more vertical resolution and less aliasing (e.g. in the vertical direction).

It is noted that this increase in vertical uniformity and resolution comes at the price of not having a long exposure blue pixel in every other column of a row of pixels 28, as compared to pixels 25 which do have a long exposure blue pixel in every other column pixel of a row. However, it can be appreciated that the sacrifice is acceptable because the pattern of long exposure pixels 28 is more uniform and had an increased vertical resolution (a long exposure pixel in ever other row of any three rows), while maintaining a sufficient horizontal resolution (a long exposure pixel in every other row of any three rows). This situation may also be described by saying that the long exposure blue pixels are more regular or periodic (e.g., interleaved) in the horizontal and vertical sequence and spacing of all the pixels of the array.

It can also be seen that the red pixels of pixels 26 and pixels 29 can be compared similar to the descriptions for blue pixels 25 and 28.

Thus, the Bayer symmetric interleaved exposure pattern (e.g., array 18) produces a uniform X/Y sampling of each red, green, and blue channels. In some cases, the effective red, green, and blue channel resolution is improved by a factor of 2× in the vertical direction. It is noted that different or improved (results) processing may be used to interpolate or process the data for vertical direction gaps of long exposure pixels from the Bayer symmetric interleaved exposures as compared to data from the Bayer row pair interlaced exposures.

Figure 5:
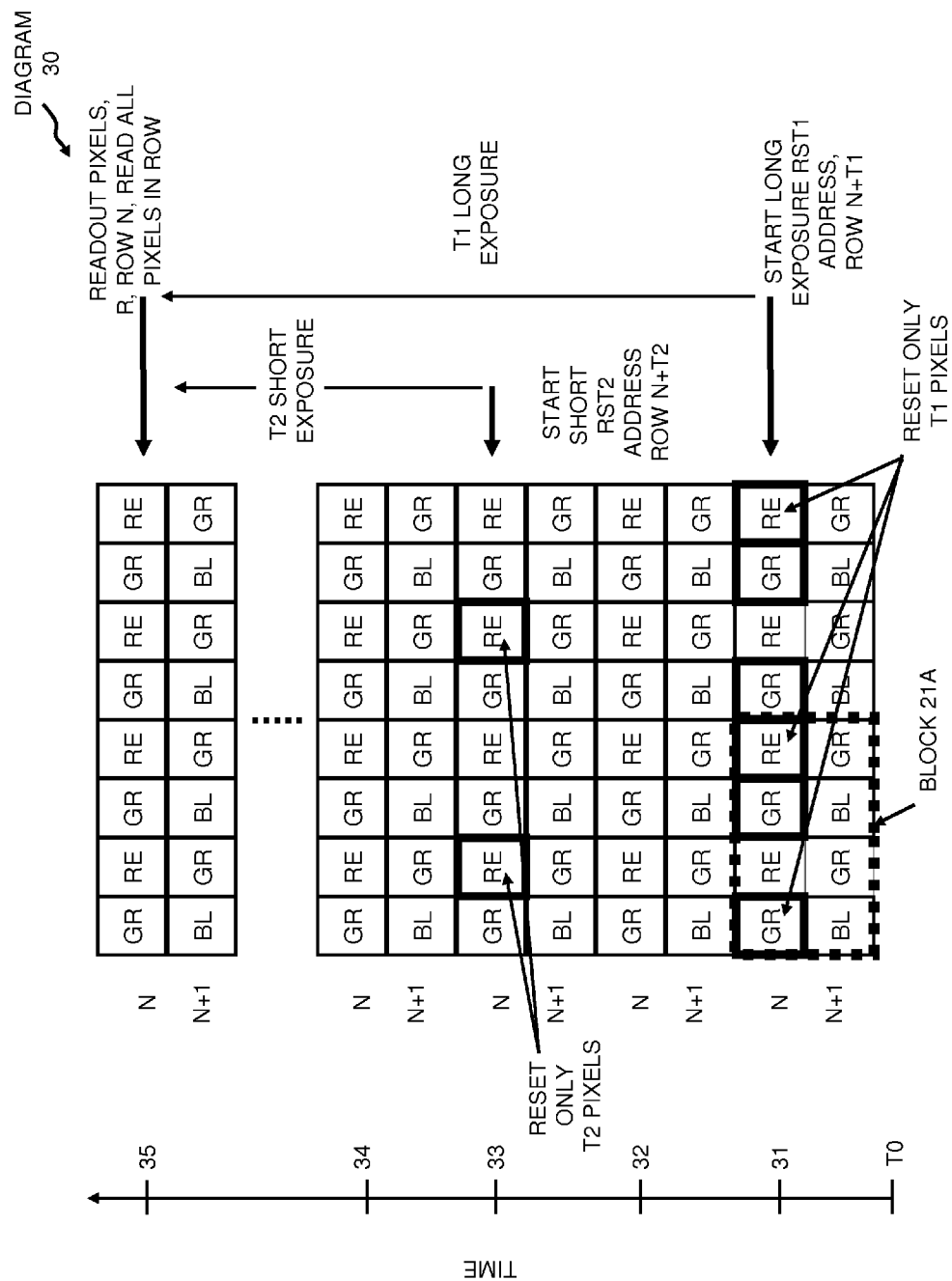
FIG. 5 is a diagram that shows a snapshot of the rolling shutter addressing for Bayer symmetric interleaved exposures, in accordance with embodiments of the invention.

FIG. 5 is a diagram that shows a snapshot of the rolling shutter addressing for Bayer symmetric interleaved exposures, in accordance with embodiments of the invention. FIG. 5 shows diagram 30 of a snapshot of a rolling shutter addressing, such as to implement an efficient block of pixels, where the snapshot shows rows N and N+1 over time increments 31-35. In some cases, rows N and N+1 correspond to rows R1 and R2. In general, row N is the current readout address, and all pixels in a row are read out at each row read operation. Exposures are started with RST1 at row address N+T1 where T1 is the long exposure time in rows and RST2 at row address N+T2 where T2 is the short exposure in rows. During the RST1 operation, only T1 pixels are reset within the row and during RST2, only T2 pixels are reset within the row. The row addresses for RST1, RST2, and R are incremented in a typical rolling shutter operation.

FIG. 5 shows diagram 30 including timeline "Time" extending from time T0 through time periods 31, 32, 33, 34, ... 35. At time 31 (or during time 31), row N is shown having only long exposure T1 pixels reset, such as by starting long exposures using long exposure reset address pointer RST1 at pixel addresses N+T1 in row N. During time 31, only the long exposure pixels are reset, but the short exposure pixels are not. Row N+1 is also shown to allow the figure to include efficient block 21A, however, pixels of row N+1 are not shown addressed in diagram 30.

At or during time 32, none of the pixels of row N are reset or read out. However, the pixels of rows N and N+1 are exposed to an image during time 32 (e.g., from time 31 to time 33).

At time 33, row N is shown having only short exposure T2 pixels reset, such as by starting short exposures using short exposure reset address pointer RST2 at pixel addresses N+T2 in row N. During time 33, only the short exposure pixels are reset, but the long exposure pixels are not. During time 33 the long exposure pixels T1 continue to be exposed to an image during (e.g., from time 32 to time 34).

In some cases the exposure control and timing for the Bayer symmetric interleaving exposure involves setting exposure times T1 and T2 for different pixels on the same row. In order to achieve this exposure control, each row may use or have access to two reset (shutter) address pointers, RST1 and RST2. In some cases, a common readout address pointer may be shared for each row as the exposure times should end at the same time to ensure rows may be read out of the sensor without memory buffering.

At or during time 34, none of the pixels of row N are reset or read out. However, the pixels of rows N and N+1 are exposed to an image during time 34 (e.g., from time 33 to time 35).

At time 35, row N (and row N+1) is shown having both long exposure T1 and short exposure T2 pixels read out, such as by using read out pointer READ at pixel addresses N+T1 and N+T2 in row N. READ pointers may read the long exposure pixels and the short exposure pixels at a plurality of times time (in a rolling shutter sequence), at or after time 35 (e.g., after time 31 and 33).

During time 35 the long and short exposure pixels T1 and T2 stop being exposed to an image (e.g., after time 35). Thus, pixels reset by long exposure reset pointer RST1 are exposed for T1, the long exposure, from time 31 to time 35. Also, pixels reset by short exposure reset pointer RST2 are exposed for T2, the short exposure, from time 33 to time 35.

Figure 6:
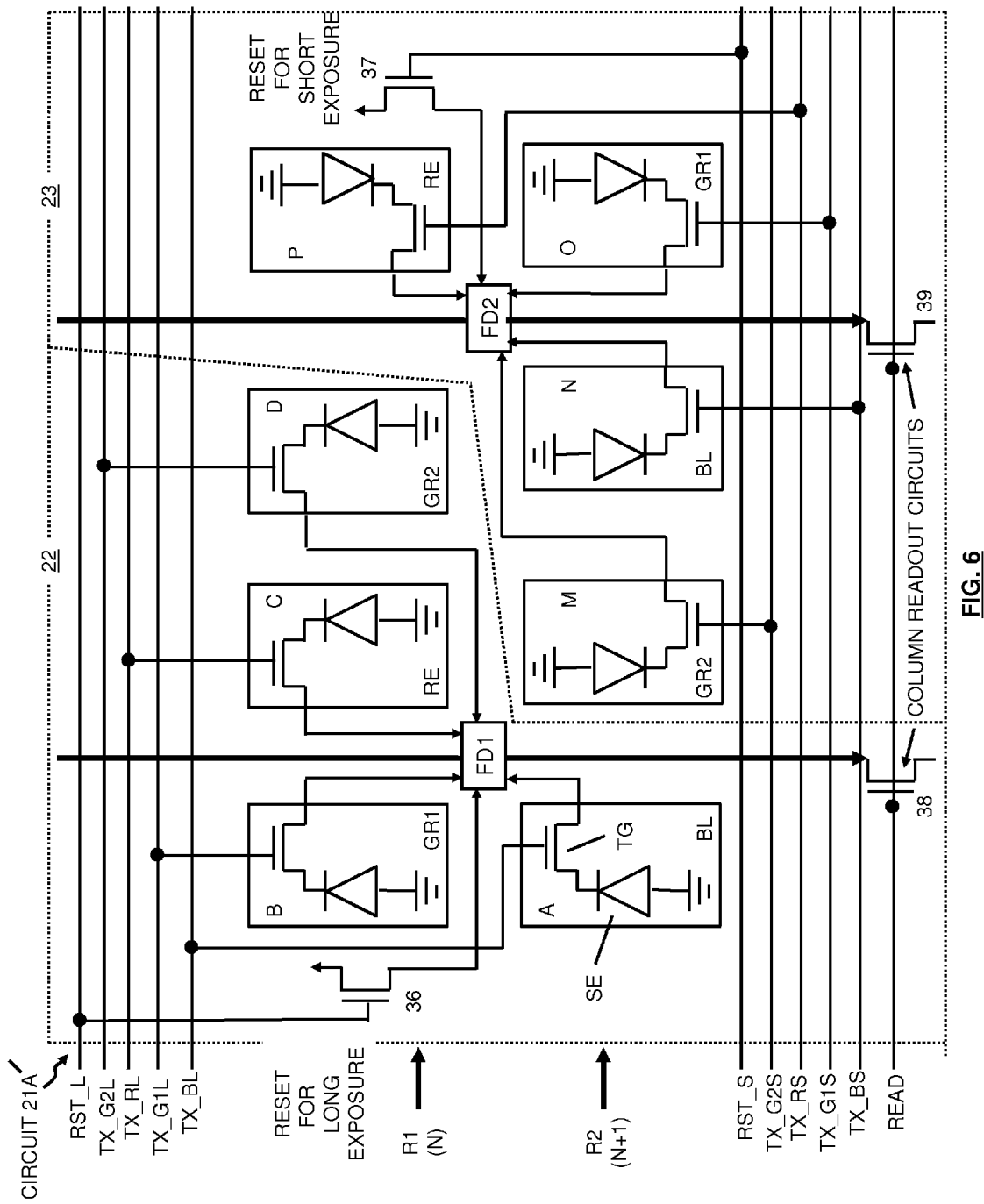
FIG. 6 is an example of a circuit able to reset only a proportion of pixels in a given row, in accordance with embodiments of the invention.

FIG. 6 is an example of a circuit able to reset only a proportion of pixels in a given row, in accordance with embodiments of the invention. FIG. 6 may correspond to a rolling shutter addressing embodiment for Bayer symmetric interleaved exposures, as described herein. FIG. 6 shows circuit 21A' of a rolling shutter addressing, such as to implement an efficient block of pixels, where the circuit shows an example of circuitry of efficient block 21A of pixels of a sensor. FIG. 6 may show circuit 21A' to implement an efficient block of pixels, over time increments 31-35 as shown in FIG. 5.

More specifically, FIG. 6 shows circuit 21A' including pattern 22 and 23 forming pixels of efficient block 21A. Pattern 22 is shown having long exposure pixels A, B, C and D which are long exposure (e.g., T1) pixels providing an output representative of sensed color BL, GR1, RE, and GR2, respectively, for creating an image. GR1 and GR2 are both green (e.g., GR) color. Pattern 23 is shown having pixels M, N, O and P which are short exposure (e.g., T2) pixels providing an output representative of sensed color GRb 2, BE, GR1, and RE, respectively, for creating an image.

FIG. 6 shows eight transfer gate "TX" lines and 2 reset "RST" lines employed for 2 pixel rows R1 and R2. The transfer gates for the long exposure pixels of pattern 22 are coupled to transfer gate lines labeled TX_G2L, TX_RL, TX_G1L, and TX_BL, one transfer gate line for each color. The short exposure pixels of pattern 23 are coupled to transfer gate lines labeled TX_G2S, TX_RS, TX_G1S, and TX_BS. The reset lines for long and short exposures are labeled RST_L and RST_S respectively.

Circuit 21A' may employ a 4-way shared pixel design where 4 pixels (e.g., long exposure or short exposure pixels of an efficient block) each share one floating diffusion readout node (e.g., FD1 or FD2) and one reset transistor (e.g., transistor 36 or 37). For example, each pixel of patterns 22 and 23 may include or have a photodiode or sensor (e.g., SE) configured to provide the detected color output (e.g., see pixel A). Each pixel of patterns 22 and 23 may also include its own transfer gate (TG) to control reset and readout of the pixels (e.g., see pixel A). The transfer gate TG transistor (e.g., a MOSFET) may be coupled between the output of the sensor SE and the floating diffusion readout (FD) node, such as by having its source coupled to the output of the sensor SE, its drain coupled to the input of the floating diffusion readout node FD. The transfer gate TG may have its gate coupled to a reset line (e.g., a TX line) capable of providing a signal to cause a reset or readout of the pixel. Each floating diffusion readout node FD may receive color inputs from the 4 pixels of its pattern and an input from a reset line (e.g., RST line and reset transistor) capable of providing a signal to cause a reset of the floating diffusion readout node FD. In some cases, two reset (shutter) address pointers (RST_L and RST_S) are needed in each row R1 and R2 so that each pixel can be reset for long or short exposure. Thus, additional circuitry and timing control is used to implement the new pattern in the image sensor as compared to the prior row pair interleaved exposure process (e.g., see FIG. 2). Each floating diffusion readout node FD may provide outputs of the received color inputs from the 4 pixels of its pattern, to a readout line (e.g., READ line and readout transistor or circuit) capable of receiving and processing the color outputs.

More specifically, FD1 has its color inputs coupled to long exposure pixels A, B, C and D of pattern 22, its reset input coupled to reset for long exposure transistor 36 (which has its gate coupled to reset line RST_L), and its output coupled to column readout transistor 38. Also, FD2 has its color inputs coupled to short exposure pixels M, N, O and P of pattern 23, its reset input coupled to reset for short exposure transistor 37 (which has its gate coupled to reset line RST_S), and its output coupled to column readout transistor 39. The gate of readout circuits 38 and 39 are coupled to read out line READ.

It can be appreciated that other circuitry and configurations are possible for implementing efficient blocks; or patterns 22 and 23 as described herein. For instance, whether pattern 22 or 23 shown in FIG. 6 is a long or short exposure pattern (e.g., pixels) depends on the timing used for the signal lines. In some embodiments, it is possible to program pattern 23 to be a long exposure pattern and pattern 22 to be a short exposure pattern. In some embodiments, all of the pixels of pattern 22 are either long or short exposure pixels; while all of the pixels of pattern 23 are either short or long (e.g., the opposite of pattern 22) exposure pixels, such as due to the use of the FD circuitry architecture.

Figure 7:
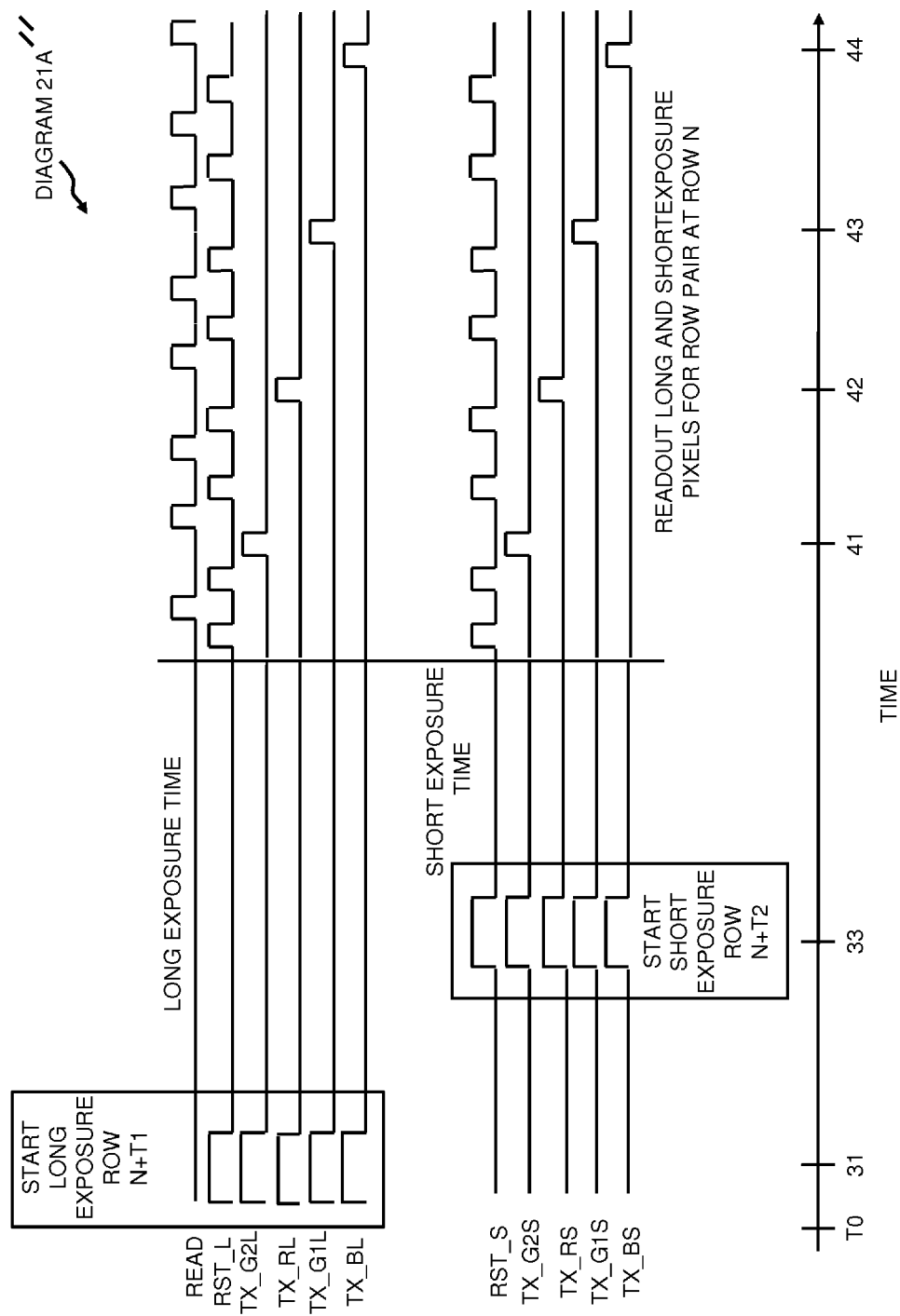
FIG. 7 is an example of a timing diagram of how a circuit may be able to reset only a proportion of pixels in a given row, in accordance with embodiments of the invention.

FIG. 7 is an example of a timing diagram of how a circuit may be able to reset only a proportion of pixels in a given row, in accordance with embodiments of the invention. FIG. 7 may correspond to timing control showing how circuit 21A' may be used to readout long and short exposures, such as for a rolling shutter addressing embodiment for Bayer symmetric interleaved exposures, as described herein. FIG. 7 shows diagram 21A" for a rolling shutter addressing, such as to implement an efficient block of pixels, where the diagram shows an example of timing for using efficient block 21A of pixels of a sensor. FIG. 7 may show timing to implement an efficient block of pixels, such as in addition increments 31-35 shown in FIG. 5.

The long exposure of pattern 22 may be started by turning on RST_L and the TX_xxL gates to reset pixels A, B, C and D of pattern 22. This is performed at row address N+T1 where N is the readout row address and T1 is the long exposure time in rows. At row N+T2, the short exposure time of pattern 23 may be started by turning on RST_S and the TX_xxS gates of pixels M, N, O and P of pattern 23, where T2 is the short exposure time. At row address N, both the long and short exposure pixels may be read out through their shared floating diffusion nodes (FD1 for pattern 22 and FD2 for pattern 23) by performing sequential RST, READ, and TX operations. This timing may progress through the pixel array by incrementing the row address N in a standard rolling shutter manner. In some cases, the floating diffusion nodes may be described as charge storage nodes. Resetting and reading out data from the patterns using the FD's may reduce the amount of circuitry required on the array, and thus may help provide more pixel space in the array.

FIG. 7 shows an example of timing for the signals provided on reset lines RST_L and RST_S; transfer gate TX lines; and readout line READ. FIG. 7 shows a reset signal asserted on lines RST_L, TX_G2L, TX_RL, TX_G1L, and TX_BL at time 31 (e.g., see FIG. 5), to reset the long exposure pixels, such as at pixel addresses of row N+T1 (e.g. refer also to FIGS. 4-6). FIG. 7 also shows a reset signal asserted on lines RST_S, TX_G2S, TX_RS, TX_G1S, and TX_BS at time 33 (e.g., see FIG. 5), to reset the short exposure pixels, such as at pixel addresses of row N+T2 (e.g. refer also to FIGS. 4-6).

FIG. 7 shows a signal asserted on transfer gate lines TX_G2L and TX_G2S at time 41. These signals may be described as signals to cause reading of long and short corresponding pairs of Gr2 pixels (e.g., pixels D and M) of efficient block 21A. Then, at time 42 FIG. 7 shows a signal asserted on transfer gate lines TX_RL and TX_RS. These signals may be described as signals to cause reading of long and short corresponding pairs of Re pixels (e.g., pixels C and P) of efficient block 21A. Then, FIG. 7 shows a signal asserted on transfer gate lines TX_G1L and TX_G1S at time 43. These signals may be described as signals to cause reading of long and short corresponding pairs of GR1 pixels (e.g., pixels B and O) of efficient block 21A. Then, at time 44 FIG. 7 shows a signal asserted on transfer gate lines TX_BL and TX_RS. These signals may be described as signals to cause reading of long and short corresponding pairs of B1 pixels (e.g., pixels A and N) of efficient block 21A. In some cases, times 41-44 are included in time 35 of FIG. 5, and/or block 55 of FIG. 8.

Once the long and short exposure pixels are read out of the sensor, they may be combined using image processing to construct a high dynamic range image, such as by processor 6 (possibly using memory 4 to store the image data during processing, and possibly using memory 4 or another memory of the portable device to run an application that performs the processing).

In some cases, reading out of the pixel array in a standard rolling shutter manner includes reading two complete rows of array 18 (e.g., R1 and R2) out of the FDs and through circuits 38 and 39 (e.g., for all efficient blocks in the two rows) at one time, and then reading the next two complete rows (e.g., below the first two rows). The two complete rows may be read through circuits 38 and 39 into two corresponding analog to digital converters (ADCs). The digital data provided from the two ADCs (e.g., for the two rows) is then output from the ADCs, such as for image processing (e.g., filtering, interpolation, etc., such as by processor 6 as noted above). After processing the data may be stored in a memory, further processed by the device, and/or displayed on a display, etc. The ADCs may be able to convert the data of each of the two rows, at one time. After the data is converted and output by the ADCs, the next two complete rows of array 18 (e.g., the next set of all efficient blocks in the next two rows) may be read into the same two analog to digital converters (ADCs).

In some embodiments, each of the lines of FIGS. 6-7 (e.g., control, reset, transfer gate, and read) corresponds to descriptions above for the similar lines or pointers (e.g., control, reset, transfer gate and read), such as of FIG. 5. In some cases, reset pointers RST1 and RST2 of FIG. 5 correspond to, cause or control the signal on the reset lines and transfer gate lines of FIGS. 6-7 to control resetting of the pixels. For example, reset pointer RST1 of FIG. 5 may cause or control the signal on the reset line RST_L; and on transfer gate lines TX_G2L, TX_RL, TXG1L, and TX_BL of FIGS. 6-7 to control resetting of the long exposure pixels (e.g., of pattern 22). Similarly, reset pointer RST2 of FIG. 5 may cause or control the signal on the reset line RST_S; and on transfer gate lines TX_G2S, TX_RS, TX_G1S, and TX_BS of FIGS. 6-7 to control resetting of the short exposure pixels (e.g., of pattern 23). In some cases, read pointer READ of FIG. 5 corresponds to, cause or control the signal on the read lines and transfer gate lines of FIGS. 6-7 to control reading out of the pixels. For example, read out pointer READ of FIG. 5 may cause or control the signal on the read line READ; and on transfer gate lines TX_G2L, TX_RL, TX_G1L, TX_BL, TX_G2S, TX_RS, TX_G1S, and TX_BS of FIGS. 6-7 to control reading out of the long and short exposure pixels (e.g., of patterns 22 and 23).

Figure 8:
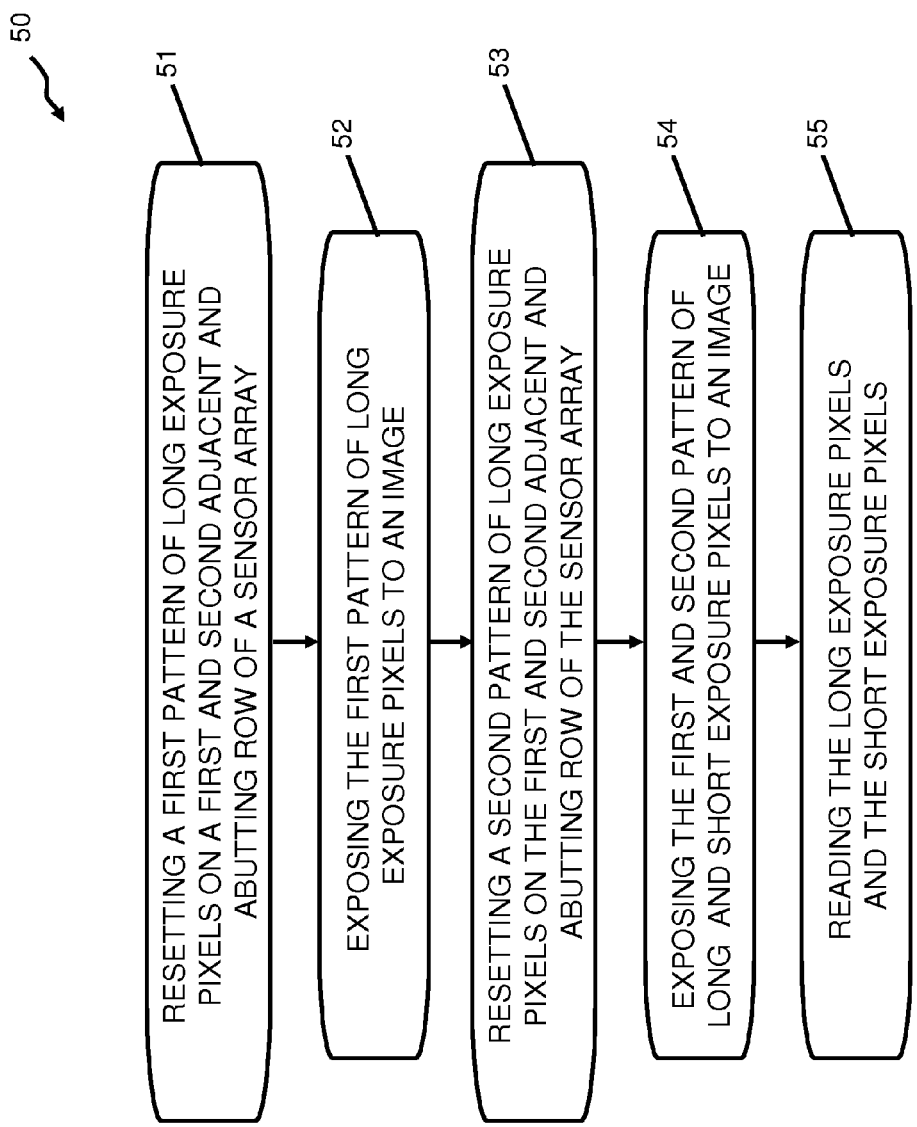
FIG. 8 is a flow chart showing a process for rolling shutter addressing for Bayer symmetric interleaved exposures, in accordance with embodiments of the invention.

FIG. 8 is a flow chart showing a process 50 for rolling shutter addressing for Bayer symmetric interleaved exposures, in accordance with embodiments of the invention. Process 50 may be a process to perform for Bayer symmetric interleaved exposures, such as using array 18, efficient block 21A, circuit 21', and/or timing 21A" as described herein. In some cases, FIG. 8 may be described as a process that includes image sensor processing.

Process 50 starts at block 51. At block 51, a first pattern of long exposure pixels are reset (e.g., simultaneously). The first pattern may include different color pixels on a first and second adjacent and abutting (e.g., sequential or touching) rows of a sensor array. The first pattern may be pattern 22. Block 51 may include simultaneously resetting the first, second, third and fourth long exposure pixels of an efficient block. In some cases, block 51 corresponds with time 31 of FIGS. 5 and 7.

Then, at block 52, the first pattern of long exposure pixels is exposed to an image. Block 52 may include exposure for a sufficient time for the first pattern to begin generating at least 100 percent minus T2/T1 of the minimum brightness of image data needed for the imager to form an image. In some cases, block 52 corresponds with time 32 of FIG. 5.

Then, at block 53 a second pattern of short exposure pixels are reset (e.g., simultaneously). The second pattern may include different color pixels on the same first and second adjacent and abutting (e.g., sequential or touching) rows of the sensor array. The second pattern may be pattern 23. Block 53 may include simultaneously resetting the first, second, third and fourth short exposure pixels of an efficient block. In some cases, block 53 corresponds with time 33 of FIGS. 5 and 7.

Then, at block 54, the first and second pattern of long and short exposure pixels are exposed to the image. Block 54 may include exposure for a sufficient time for the first pattern to generating at least 100 percent times T2/T1 of the minimum brightness of image data needed for the imager to form an image. In some cases, block 54 corresponds with time 34 of FIG. 5.

Then, at block 55 the long exposure pixels and the short exposure pixels are read. Block 55 may include reading the pixel data out of the array, such as through one or more FD nodes. Block 55 may include reading corresponding color pairs (e.g., Gr1, Gr2, Re, or Bl) of the long and short exposure pixels at a plurality of third times in a rolling shutter sequence, wherein the third times are after blocks 51 and 53. In some cases, block 55 corresponds with time 35 of FIG. 5, and times 51-54 of FIG. 7.

Process 50 may include exposing the first pattern of long exposure pixels for a long period T1 of time from block 51 to block 55, and exposing the second pattern of short exposure pixels for a short period T2 of time from block 53 to block 55, which is shorter than the long period of time.

In some cases, T2/T1 may be between is 1/50 and 1/4. In some cases times T2/T1 can be between 1/10 and 1/20. In some cases times T2/T1 can be 1/15. For example, T2 may be half as long as T1. It can be appreciated that other ratios or percentages may work well to achieve the benefits noted herein for using Bayer symmetric interleaved exposures, such as based on efficient blocks of pixels. In some embodiments, exposure time T1 and T2 may periods of time having a relationship similar to that used for Bayer row pair interlaced exposure long and short exposure time periods.

It is considered that the diagrams, circuitry and descriptions above for FIGS. 5-8 may be repeated for other (e.g., adjacent) efficient blocks, such as those described for FIG. 3B. Such other blocks may fill the entire pixel area, or contain all of the image pixels of array 18.

Some embodiments of image sensor array 18 can be described as having long exposure reset pointers (e.g., RST1 pointers or circuitry) to reset (e.g., configured to reset, or for resetting) a first pattern of long exposure pixels, wherein the first pattern includes (different color) pixels on a first and second adjacent and abutting (sequential, touching) row of the sensor array. The array may also have short exposure reset pointers (e.g., RST2 circuitry) to reset a second pattern of short exposure pixels, wherein the second pattern includes different (different color) pixels on the first and second adjacent and abutting row of the sensor array, where the second time is after the first time. The array may use read pointers to read the long exposure pixels and the short exposure pixels. The long exposure reset pointers, the short exposure reset pointers, and the read pointers may all be configured to expose the first pattern of long exposure pixels for a long period of time, and expose the second pattern of short exposure pixels for a short period of time which is shorter than the long period of time.

In some embodiments, the long and short exposure reset pointers or signals can also be programmed to occur at the same time (e.g., to be synchronized) so that all of the pixels of the efficient block are exposed for the same amount of time (e.g., T1 or T2). For example, all of the pixels of the efficient block (and array) can be reset at the same time and read out at the same time. In this case, array 18 can be programmed to be a non-interleaved Bayer sensor array, and/or a non-high dynamic range (HDR) sensor. One advantage here is that the pixels of the array can be tested and/or calibrated. For example each pixel can be tested to determine whether it functioning or providing output. Also, each pixel of a color can be tested or calibrated to determine whether it is providing similar brightness levels for the same exposure time to the same input (image). If a pixel is not producing the same brightness as others, an adjustment to the pointers; or additional interpolation or filtering can be provided to "calibrate" that pixel so that a better or higher dynamic range images are produced by the array. In addition, having all of the pixels of the efficient block exposed for the same amount of time allows array 18 to function as a "global shutter" image array, such as to provide a (non-rolling) image with uniform brightness exposure time for all the pixels.

Figure 9:
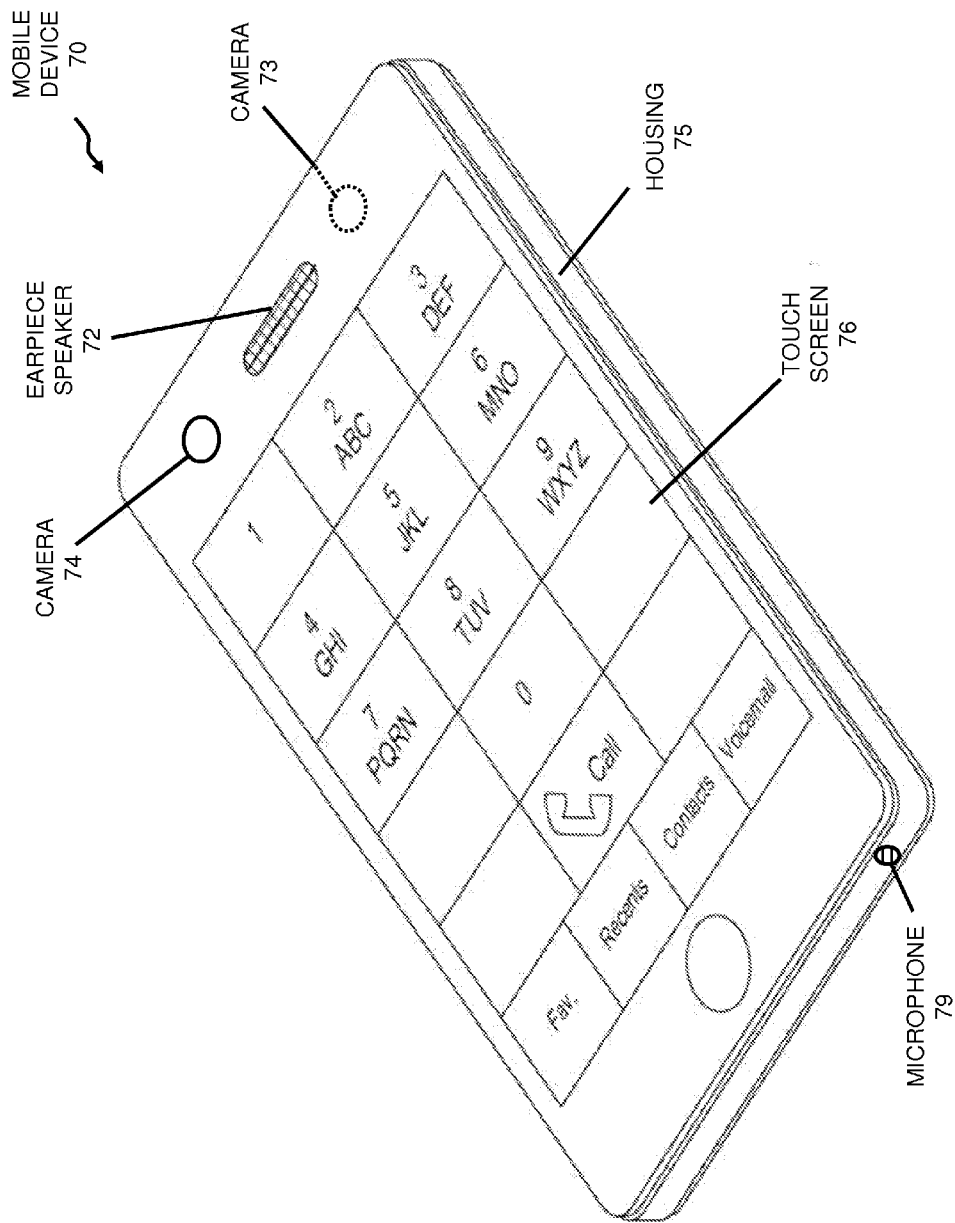
FIG. 9 depicts an example mobile device in which an embodiment of the imaging system can be implemented.

FIG. 9 shows an example mobile device 70 and circuitry in which embodiments of Bayer symmetric interleaved exposures, such as based on efficient blocks of pixels, can be implemented. The mobile device 70 may be a personal wireless communications device (e.g., a mobile telephone) that allows two-way real-time conversations (generally referred to as calls) between a near-end user that may be holding the device 70 against her ear, using a headset (not shown) or speaker mode (e.g., while taking a picture or video using a camera of the phone), and a far-end user. This particular example is a smart phone having an exterior housing 75 that is shaped and sized to be suitable for use as a mobile telephone handset. There may be a connection over one or more communications networks between the mobile device 70 and a counterpart device of the far-end user. Such networks may include a wireless cellular network or a wireless local area network as the first segment, and any one or more of several other types of networks such as transmission control protocol/internet protocol (TCP/IP) networks and plain old telephone system networks.

The mobile telephone 70 of FIG. 9 includes housing 75, touch screen 76, microphone 79, and ear-piece 72. During a telephone call, the near-end user may listen to the call using an earpiece speaker 72 located within the housing of the device and that is acoustically coupled to an acoustic aperture formed near the top of the housing. The near-end user's speech may be picked up by microphone 79 whose acoustic aperture is located near the bottom of the housing. Also included in the housing may be electronic components that interface with the speaker 72 and the microphone 79. The circuitry may allow the user to listen to the call through a wireless or wired headset (not shown) that is connected to a jack of mobile device 70. The call may include sending pictures or video taken with the imaging system. The call may be conducted by establishing a connection through a wireless network, with the help of RF communications circuitry coupled to an antenna that are also integrated in the housing of the device 70.

A user may interact with the mobile device 70 by way of a touch screen 76 that is formed in the front exterior face or surface of the housing. The touch screen may be an input and display output for the wireless telephony device. The touch screen may be a touch sensor (e.g., those used in a typical touch screen display such as found in an iPhone™ device by Apple Inc., of Cupertino California). As an alternative, embodiments may use a physical keyboard may be together with a display-only screen, as used in earlier cellular phone devices. As another alternative, the housing of the mobile device 70 may have a moveable component, such as a sliding and tilting front panel, or a clamshell structure, instead of the chocolate bar type depicted.

According to embodiments, one or more of imaging system I of FIG. 1 may be installed into device 70. As noted above, imaging system I may use Bayer symmetric interleaved exposures, such as based on efficient blocks of pixels of an image array sensor that interleave long and short exposure pixels across two adjacent rows of the sensor, as described herein to capture still and/or video images (frames). For example, device 70 is shown having camera 73, such as one of imaging system 1, mounted to capture images of a scene and/or objects below the bottom surface of housing 75. In some cases, device 70 has camera 74, such as one of imaging system 1 mounted to capture images of a scene and/or objects above the top surface of housing 75. It is also possible for device 70 to have both, camera 73 and 74. In this case the cameras may each be part of separate imaging systems 1; or may have separate lens 2 and sensor 8, but share the other components or circuitry of the imaging system. Thus, camera 73 and/or 74 may be used to capture still images or video (e.g., of a scene) to be stored and/or transmitted via SMS, email, or phonecall by device 70. The video may have frames synchronized in time with audio input from microphone 79 or a microphone of a headset. The mobile device 70 may allow two-way calls between a near-end user taking video using camera 74 of the phone, and a far-end user possibly also taking video to perform video conferencing or chatting.

It should be understood that the present embodiments of imaging system 1 could be incorporated on a wide variety of mobile telephones 70. It is also noted that imaging system I could be incorporated into devices such as personal digital assistants, personal computers, and other mobile and non-mobile devices (e.g., security systems, and mounted cameras).

A process, circuitry, logic and/or software (e.g., executed by a processor) may be used to perform or accomplish the descriptions above for FIGS. 1-9 in order to use Bayer symmetric interleaved exposures, such as based on efficient blocks of pixels of an image array sensor that interleave long and short exposure pixels across two adjacent rows of the sensor.

Some embodiments of the present invention may be described in the general context of image sensor devices, processes or systems. In some embodiments, the device, processes or systems may be implemented by (or include) a program product including computer-executable instructions (e.g., software program instructions), such as program code or instruction, to be executed by a computer. The program product may be instructions stored on a non-volatile or tangible medium configured to store or transport the instructions, or in which computer readable code may be recorded or embedded. Some examples of computer program products are flash drives, USB drives, DVDs, CD-ROM disks, ROM cards, floppy disks, magnetic tapes, computer hard drives, and server storage on a network. For instance, an embodiment of the invention can be implemented as computer software in the form of computer readable code (e.g., read from a non-volatile or tangible medium and) executed by a computer (e.g., system, 1, processor 6 or another processor of device 70) illustrated in FIGS. 1 and 9. It can also be implemented on a laptop computer, a PC (e.g., by Apple Inc., of Cupertino California, or another manufacturer), or in the form of bytecode class files running on such a computer. Such a computer or processor may perform the processes described herein with respect to FIGS. 1-9, such as using Bayer symmetric interleaved exposures, such as based on efficient blocks of pixels of an image array sensor that interleave long and short exposure pixels across two adjacent rows of the sensor.

Some embodiments include an imaging system having a processor and a memory unit operatively connected to the processor, the memory unit including computer program instructions for using Bayer symmetric interleaved exposures, such as based on efficient blocks of pixels of an image array sensor, as described herein. In some cases the processor may be processor 6 or another processor of the portable device; and the memory may be memory 4 or another memory of the portable device. In some cases, the computer program instructions (e.g., when executed by the processor) are able to use Bayer symmetric interleaved exposures as described herein, such as by resetting a first pattern (e.g., pattern 22) of long exposure pixels on a first and second adjacent and abutting row of a sensor array; then exposing the first pattern of long exposure pixels to a scene, such as including an object (e.g., an image); then resetting a second pattern (e.g., pattern 23) of short exposure pixels on the first and second row; then exposing the first and second pattern of long and short exposure pixels to the image; then reading the long exposure pixels and the short exposure pixels, such as in a rolling shutter sequence.

It also is considered that the computer program instructions mentioned herein may be embodied in a computer-readable medium storing data and instructions to cause a programmable processor to perform operations described. The medium may be tangible and/or non-volatile. The program (e.g., program product) may cause a computer or other device to for use Bayer symmetric interleaved exposures, such as based on efficient blocks of pixels of an image array sensor, as described herein.

Although descriptions above for sensor 8, are with respect to a Bayer pattern color array, it is considered that using symmetric interleaved exposures, such as based on efficient blocks of pixels of an image array sensor that interleave long and short exposure pixels across two adjacent rows of the sensor, may be applied to other types of image sensor arrays.

For example, according to embodiments, descriptions above for sensor 8 (e.g., the processes, techniques and pattern of FIGS. 3-9) may be applied to similar array patterns or efficient block embodiments that use clear or monochrome pixels in place of the long and/or short exposure green pixels in the Bayer pattern. One advantage for using clear pixels is to improve low light sensitivity. In some cases, clear pixels can be used for sensors with small pixels due to this benefit. Some clear pixels may detect an illumination level for all colors, instead of for a specific color or subset of colors. Thus, one explanation is that each color pixel cuts out about ⅔ of the total available light falling on the pixel (e.g., such as by filtering in incoming light to only detect a certain color). On the other hand, when there is no color filter, such as for a clear or a monochrome pixel, the amount of signal detected (e.g., illumination level, or output signal of the clear or a monochrome pixel sensor pixel) can be as much as 2.5 to 3× greater than that of a color pixel (e.g., GR, RE or BL).

Figures 10A, 10B, 10C:
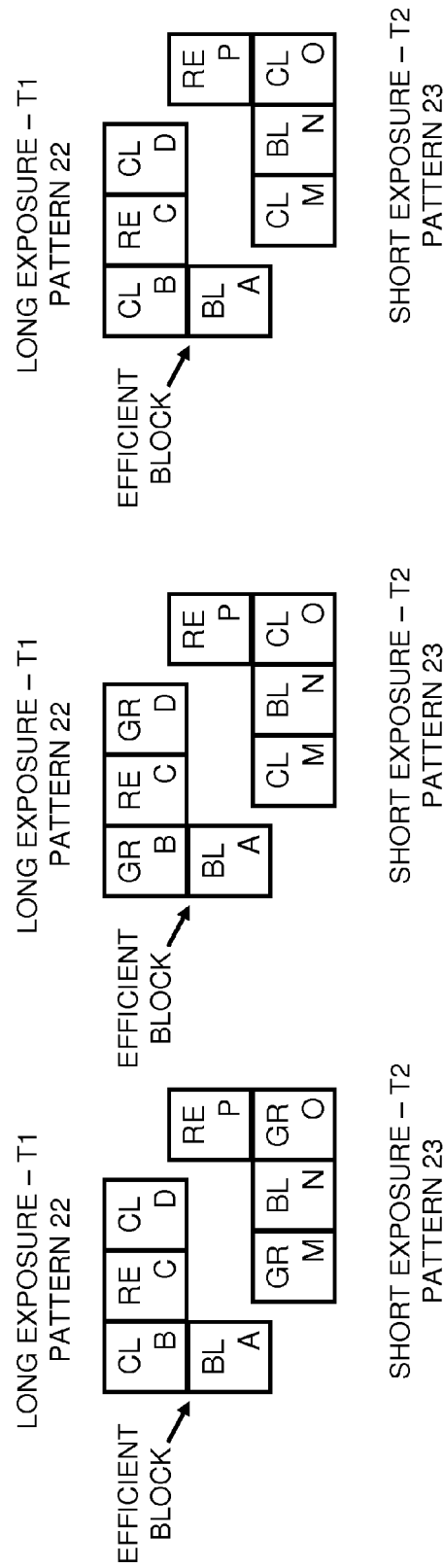
FIG. 10A shows an embodiment using clear or monochrome pixels in place of the long exposure green pixels in the Bayer pattern.
FIG. 10B shows an embodiment using clear or monochrome pixels in place of the short exposure green pixels in the Bayer pattern.
FIG. 10C shows an embodiment using clear or monochrome pixels in place of the long and short exposure green pixels in the Bayer pattern.

FIG. 10A shows an embodiment using clear or monochrome pixels in place of the long exposure green pixels in the Bayer pattern. Pixels colors are shown as red ("RE"), green ("GR"), blue ("BL"), and clear or monochrome ("CL"). Here, the green pixels of pattern 22 of block 21A have been replaced with clear pixels. In this case, the green signal in the long exposure pattern 22 (e.g., the signal to represent green at pixels B and D) may be interpolated from the clear, red, and blue signals of surrounding pixels. For example, the green signal at pixel B may be interpolated from signals of surrounding pixels including clear pixel B, red pixel C, and blue pixel A. In some cases the green signal at pixel B may be interpolated from additional signals of surroundings clear pixels, red pixels, and blue pixels.

In another example FIG. 10B shows an embodiment using clear or monochrome pixels in place of the short exposure green pixels in the Bayer pattern. Here, the green pixels of pattern 23 of block 21A have been replaced with clear pixels. In this case, the green signal in the short exposure pattern 23 (e.g., the signal to represent green at pixels M and O) may be interpolated from the clear, red, and blue signals of surrounding pixels.

FIG. 10C shows an embodiment using clear or monochrome pixels in place of the long and short exposure green pixels in the Bayer pattern. Here, the green pixels of patterns 22 and 23 of block 21A have been replaced with clear pixels. In this case, the green signal in the long exposure pattern 22 and the short exposure pattern 23 (e.g., the signal to represent green at pixels B, D, M and O) may be interpolated from the clear, red, and blue signals of surrounding pixels.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the sensor has been described in connection with portable devices, similar sensors, systems and processes can be implemented in connection with other digital image capture devices such as high-definition video cameras for the motion picture industry, image scanners, professional still photography cameras, consumer-level "point-and-shoot" cameras and various hand-held personal devices.

What is claimed is:

1. An image sensor array comprising:
   long exposure reset pointer circuitry to reset a first pattern of long exposure pixels, wherein the first pattern includes different color pixels on a first and second sequential and touching rows of the sensor array;
   short exposure reset pointer circuitry to reset a second pattern of short exposure pixels, wherein the second pattern includes different color pixels on the first and second rows of the sensor array, wherein the first and second patterns together form a four column by two row block of pixels which include, (1) a first row of three long exposure pixels and one short exposure pixel, and (2) a second row of three short exposure pixels and one long exposure pixel; and
   read pointer circuitry to read the long exposure pixels and the short exposure pixels, wherein the long exposure reset pointer circuitry, the short exposure reset pointer circuitry, and the read pointer circuitry are configured to expose the first pattern of long exposure pixels for a long period of time, and expose the second pattern of short exposure pixels for a short period of time which is shorter than the long period of time.

2. The sensor of claim 1, further comprising:
   a first floating diffusion readout node coupled to the long exposure pixels; and
   a second floating diffusion readout node coupled to the short exposure pixels.

3. The sensor of claim 1, wherein the 4 column by 2 row block of pixels is a first block of pixels, the sensor further comprising a 4 column by 2 row second block of pixels of which the first row is three long exposure pixels and one short exposure pixel; the second row is three short exposure pixels and one long exposure pixel;
   a third floating diffusion readout node is coupled to the long exposure pixels of the second block; and
   a fourth floating diffusion readout node is coupled to the short exposure pixels of the second block.

4. The sensor of claim 1, wherein the first pattern is a capital "L" shape of 4 pixels rotated 90 degrees clockwise; and wherein the second pattern is a capital "L" shape of 4 pixels rotated 90 degrees counter-clockwise.

5. The sensor of claim 1, wherein each of the first and second patterns include red, green and blue color pixels; and wherein the read pointer circuitry is to read corresponding pairs of the long and short exposure pixels in a rolling shutter sequence.

6. The sensor of claim 2, wherein:
   the long exposure reset pointer circuitry is coupled to the first floating diffusion readout node,
   the short exposure reset pointer circuitry is coupled to the second floating diffusion readout node,
   the read pointer circuitry is configured to read corresponding color pairs of the long and short exposure pixels at a plurality of times in a rolling shutter sequence.

7. An image sensor array comprising:
   long exposure reset pointer circuitry to reset a first pattern of long exposure pixels at a first time, wherein the first pattern includes pixels on a first and second adjacent and abutting rows of the sensor array;
   short exposure reset pointer circuitry to reset a second pattern of short exposure pixels at a second time, wherein the second pattern includes pixels on the first and second adjacent and abutting rows of the sensor array, wherein the first and second patterns together form a four column by two row block of pixels, which includes (1) a first row of three long exposure pixels and one short exposure pixel, and (2) a second row of three short exposure pixels and one long exposure pixel; and
   read pointer circuitry to read the long exposure pixels and the short exposure pixels at a plurality of time, after the first and second time.

8. The sensor of claim 7, wherein the image sensor array is a Bayer pattern pixel array; and wherein the first and second pattern form diagonal bands of longer pixel exposure and shorter pixel exposure across the array.

9. The sensor of claim 7, wherein the first pattern is a capital "L" shape of 4 pixels rotated 90 degrees clockwise; and wherein the second pattern is a capital "L" shape of 4 pixels rotated 90 degrees counter-clockwise.

10. The sensor of claim 8, wherein the first and second pattern form a 4 column by 2 row block of pixels including:
   a first row having a first, a second and a third long exposure pixels and having a first short exposure pixel; and a second row having a second, a third and a fourth short exposure pixels and having a fourth long exposure pixel.

11. The sensor of claim 8, wherein the 4 column by 2 row block of pixels is a first block of pixels, the sensor further comprising a 4 column by 2 row second block of pixels of which the first row has a fifth, a sixth and a seventh long exposure pixel and has a fifth short exposure pixel;
the second row has a sixth, a seventh, and an eighth short exposure pixel and has an eighth long exposure pixel;
a third charge storage node is coupled to the fifth, sixth, seventh, and eighth long exposure pixels of the second block; and
a fourth charge storage node is coupled to the fifth, sixth, seventh, and eighth short exposure pixels of the second block.

12. The sensor of claim 10, further comprising:
a first charge storage node coupled to the first, second, third and fourth long exposure pixel; and
a second charge storage node coupled to the first, second, third and fourth short exposure pixels.

13. The sensor of claim 12, wherein:
the long exposure reset pointer circuitry is coupled to the first charge storage node and are configured to reset the first through fourth long exposure pixels at the first time,
the short exposure reset pointer circuitry is coupled to the second charge storage node and is configured to reset the first through fourth short exposure pixels at the second time, and
the read pointer circuitry is configured to:
read the third long and second short exposure pixels at a third time,
read the second long and first short exposure pixels at a fourth time after the third time,
read the first long and fourth short exposure pixels at a fifth time after the fourth time, and
read the fourth long and third short exposure pixels at a sixth time after the fifth time.

14. The sensor of claim 11, wherein:
the long exposure reset pointer circuitry is configured to reset the first through eighth long exposure pixels at the first time,
the short exposure reset pointer circuitry is configured to reset the first through eighth short exposure pixels at the second time, and
the read pointer circuitry is configured to read corresponding pairs of the long and short exposure pixels in a rolling shutter sequence.

15. A method comprising:
resetting a first pattern of long exposure pixels, wherein the first pattern includes pixels on a first and second adjacent and abutting rows of a sensor array;
exposing the first pattern of long exposure pixels to an image;
resetting a second pattern of short exposure pixels, wherein the second pattern includes pixels on the first and second adjacent and abutting rows of the sensor array, wherein the first and second patterns together form a four column by two row block of pixels which includes, (1) a first row of three long exposure pixels and one short exposure pixel, and (2) a second row of three short exposure pixels and one long exposure pixel;
exposing the first and second pattern of long and short exposure pixels to the image; and
reading the long exposure pixels and the short exposure pixels, wherein reading comprises exposing the first pattern of long exposure pixels for a long period of time, and exposing the second pattern of short exposure pixels for a short period of time which is shorter than the long period of time.

16. The method of claim 15, wherein the first and second pattern form a 4 column by 2 row block of pixels including:
a first row having a first, a second and a third long exposure pixel and having a first short exposure pixel; and
a second row having a second, a third and a fourth short exposure pixels and having a fourth long exposure pixel.

17. The method of claim 16, further comprising:
simultaneously resetting the first, second, third and fourth long exposure pixels; and then
simultaneously resetting the first, second, third and fourth short exposure pixels.

18. The method of claim 16, wherein the 4 column by 2 row block of pixels is a first block of pixels, the sensor further comprising a 4 column by 2 row second block of pixels of which the first row has a fifth, a sixth and a seventh long exposure pixel and has a fifth short exposure pixel;
the second row has a sixth, a seventh, and an eighth short exposure pixel and has an eighth long exposure pixel;
simultaneously resetting the fifth, sixth, seventh, and eighth long exposure pixels of the second block; then
simultaneously resetting the fifth, sixth, seventh, and eighth short exposure pixels of the second block; and then
reading corresponding color pairs of all of the long and short exposure pixels at a plurality of third times in a rolling shutter sequence, wherein the third times are after the second time.

19. The method of claim 17, wherein:
reading comprises reading corresponding color pairs of the long and short exposure pixels at a plurality of third times in a rolling shutter sequence, wherein the third times are after the second time.

* * * * *